(12) United States Patent
Sutcliffe

(10) Patent No.: US 6,352,890 B1
(45) Date of Patent: Mar. 5, 2002

(54) METHOD OF FORMING A MEMORY CELL WITH SELF-ALIGNED CONTACTS

(75) Inventor: Victor C. Sutcliffe, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,271

(22) Filed: Sep. 23, 1999

Related U.S. Application Data

(60) Provisional application No. 60/102,379, filed on Sep. 29, 1998.

(51) Int. Cl.[7] .......................................... H01L 21/8242
(52) U.S. Cl. ..................... 438/241; 438/239; 438/240; 438/242; 438/253; 438/254; 438/255; 438/258; 438/396; 438/397; 438/398; 438/399
(58) Field of Search ................................ 438/239–242, 438/250–256, 393–399, 258

(56) References Cited

U.S. PATENT DOCUMENTS 5,946,566 A * 8/1999 Choi ........................... 438/239
6,268,246 B1 * 7/2001 Ukita et al. .................. 438/253

FOREIGN PATENT DOCUMENTS

| JP | 01144671 A | * | 6/1989 | ........... H01L/27/10 |
| JP | 02275665 A | * | 11/1990 | ......... H01L/27/108 |

* cited by examiner

Primary Examiner—John F. Niebling
Assistant Examiner—Jennifer M. Kennedy
(74) Attorney, Agent, or Firm—Carlton H. Hoel; W. James Brady, III; Frederick J. Telecky, Jr.

(57) ABSTRACT

In one embodiment, the present invention provides a method of forming a dynamic random access memory device which utilizes self-aligned contact pads 40a and 40b for the bit line and storage node contacts. A transfer gate 14 is formed at the fact of a semiconductor region 30. The semiconductor 30 includes a bit line contact region 44 and storage node contact region adjacent opposite edges of the transfer gate 14. Transfer gate 14 is surrounded with an insulating material 34/38. A conductive layer 40 is formed over the transfer gate 14, over the bit line contact region 44 and over the storage node contact region. This conductive layer 40 is then etched so that a first portion 40a of the conductive layer 40 provides an electrical contact to the bit line contact region 44 and a second portion 40b of the conductive layer 40 provides an electrical contact to the storage node contact region. The bit line 18 and storage node electrode 22 can then be formed in electrical contact with the first and second portions of the conductive layer 40a and 40b, respectively.

15 Claims, 19 Drawing Sheets

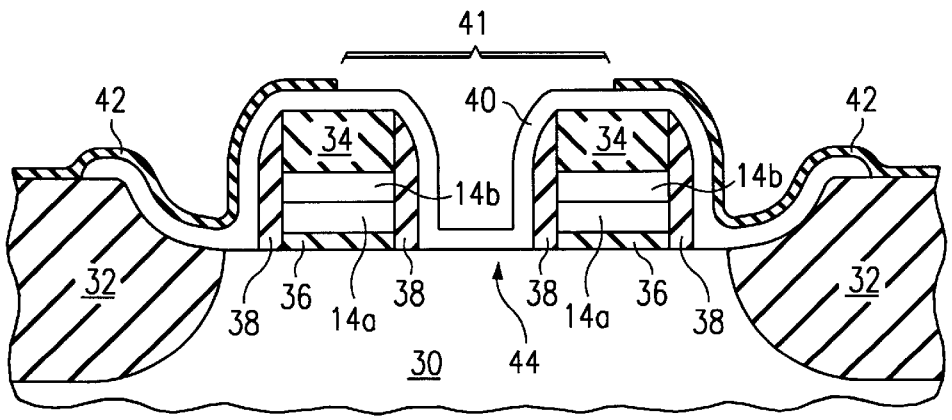
FIG. 7a
FIG. 7b
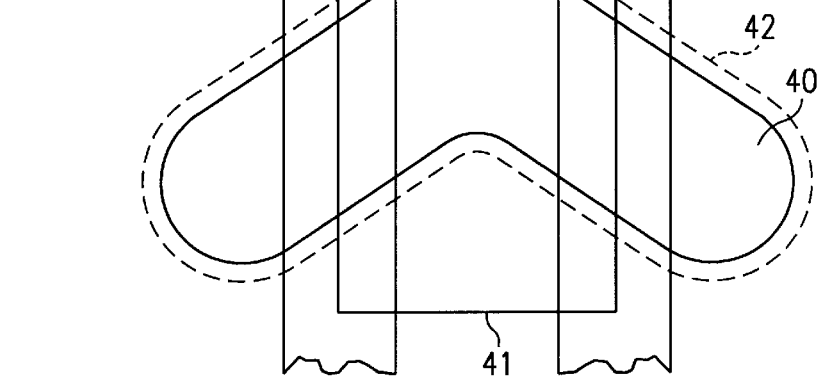
FIG. 8a
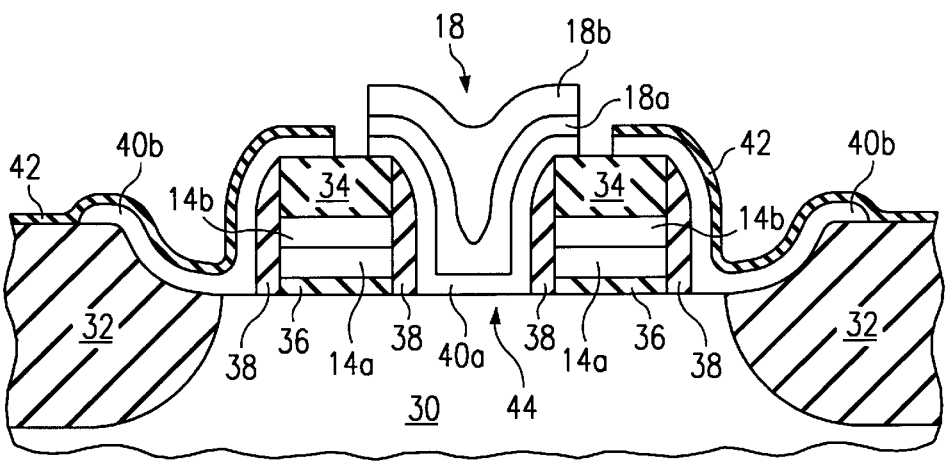

METHOD OF FORMING A MEMORY CELL WITH SELF-ALIGNED CONTACTS

This application claims priority under 35 USC §119(e)(1) of provisional application number 60/102,379 filed Sep. 9, 1998.

FIELD OF THE INVENTION

This invention relates generally to semiconductor devices and specifically to a method of forming a memory cell with an alternate self-aligned contact implementation.

BACKGROUND OF THE INVENTION

As DRAMS increase in memory cell density, there is a continuous challenge to maintain sufficiently high storage capacitance despite decreasing cell area. Additionally, there is a continuing goal to further decrease cell area. One way of increasing cell capacitance is to through cell structure techniques. Such techniques include three-dimensional cell capacitors, such as trenched or stacked capacitors.

To increase feature density and thus decrease memory cell size, Self Aligned Contacts (SAC) have been employed. The self aligned nature is accomplished by definition (patterning and etching) of a contact whose electrical contact (active) area is defined by pre-existing features and not the patterned contact area. Even when utilizing self aligned processes, the feature size is sufficiently small that complex photolithography processes (e.g., phase shifted reticules) are required for patterning and alignment is critical.

In some processes for forming DRAM devices, the active contact area is defined by removing (etching) the contact oxide defined by the pattern (mask) and is self-aligned to some particular structures (e.g., the transfer gate and field oxide region). To provide insulation and selectivity for the contact oxide to the self align structures an alternate dielectric material (e.g., silicon nitride=$SiN_4$) is used to encapsulate the transfer gate. The dielectric exists on the top (defined at the previous gate patterning operation) and sides ) formed at the previous sidewall formation) of the transfer gate. The active device area (moat), a silicon region, is defined by the isolation oxide (field oxide). The implementation of this technique utilizes differences in etch rates of dissimilar materials (etch selectivity) to provide final film thickness and over-etch process margin.

The utilization of the silicon nitride to encapsulate the transfer gate sidewall material increases the parasitic capacitance to adjacent conductor lines due to the high dielectric constant of the material. This type of approach has high process complexity and low process margin. Both problems are the result of the small contact size and inadequate selectivity (ratio of silicon dioxide etch rate to silicon nitride etch rate) during silicon dioxide etching of the contact with the available etch technology (tools and processes).

SUMMARY OF THE INVENTION

The present invention provides a method of forming a memory cell with a new approach for self-aligned contacts, which overcomes many of the problems exhibited by the prior art. For example, the present invention decreases process complexity, decreases parasitic capacitance to adjacent electrical conductors (e.g., DRAM word line), increases patterning process margin and increases etching process margin by utilizing fewer process steps, lower dielectric constant materials, relaxing minimum feature size at the contact patterning and by elimination of the need for high silicon dioxide ($SiO_2$) to silicon nitride ($SiN_4$) selectively at contact etching. Aspects of the invention will have specific application in 64 Meg and larger DRAM process flows and beyond.

The present invention implements self aligned electrical connections without hole (contact) pattern definition. Planar conductive (polysilicon) and insulating (silicon dioxide and silicon nitride) films are used to enable the use of high selectivity etch processes for stacked memory structure cell definition.

In one embodiment, the present invention provides a method of forming a dynamic random access memory device, which utilizes self-aligned contact pads for the bit line and storage node contacts. A transfer gate is formed at the face of a semiconductor region. The semiconductor region includes a bit line contact region and a storage node contact region at opposite edges of the transfer gate. The transfer gate is surrounded with an insulating material, preferably silicon dioxide. A conductive layer is formed over the transfer gate, over the bit line contact region and over the storage node contact region. This conductive layer is then etched so that a first portion of the conductive layer provides an electrical contact to the bit line contact region and a second portion of the conductive layer provides an electrical contract to the storage node contact region. The bit line and storage nodes can then be formed in electrical contact with the first and second portions of the conductive layer, respectively.

Concentrating on another aspect of the present invention, first and second transfer gates are formed at the face of a semiconductor region. The semiconductor region includes a bit line contact region located between the first an second transfer gates. As before, the transfer gate is surrounded with an insulating material such as silicon dioxide.

A conductive layer, preferably polysilicon, is formed over the transfer gate, over the bit line contact region and over the storage node contact region. A masking layer, preferably silicon dioxide, is then formed over the conductive layer. A contact window is then formed by removing a portion of the masking layer so as to expose a portion of the conductive layer over the bit line contact regions and over portions of the first and second transfer gates which are adjacent to the bit line contract region.

A bit line layer(s) can then be formed over the masking layer and the exposed portion of the conductive layer. A bit line can then be formed by patterning and etching the bit line layer. This patterning and etching step also exposes a portion of the conductive layer between the masking layer and the bit line. The exposed portion of the conductive layer can then be removed using the masking layer as a mask. A storage node electrode can then be formed in electrical contact with a portion of the conductive layer, which overlies the storage node contact region.

The method of the present invention can be used to fabricate a novel memory device. This device includes at least one transfer gate formed in an active region of a semiconductor device. The transfer gate is spaced from a field oxide region by a contact region within the active region. A top surface insulator is disposed along the top surface of the transfer gate and is formed from a first material (e.g., an oxide). A sidewall insulator is disposed along the sidewall of the transfer gate and is formed from a second material (e.g., an oxide). A conductive pad (e.g., polysilicon) extends from over a portion of the field oxide region to over a portion of the top surface insulator. This conductive pad abuts the contact region of the active area. A storage node conductor, which serves as one plate of a capacitor, abuts the conductive pad.

In another aspect, a novel memory device includes first and second transfer gates. Both gates have a top surface insulator and a sidewall insulator. The top surface insulator a sidewall insulator are formed from different materials. A conductive pad extends over a portion of the first top surface insulator, the first sidewall insulator, the contact region within the active area, the second sidewall insulator, and a portion of the second top surface insulator. The conductive pad abuts the contact region of the active area. A bit line conductor comprises a bit line within a memory array.

The present invention has a number of advantages over prior art processes. First, process complexity is reduced by the elimination of two etches, two polysilicon depositions, one silicon dioxide deposition and one silicon nitride deposition as compared with other processes. In addition, the contact etch margin is improved by the elimination of special high selectivity processes. Only industry standard etch processes are required to implement the poly pad self aligned contact process. The industry standard interconnect contact etch process selectivity is sufficient to provide over etch margin.

This processing approach also reduces word line (transfer gate) parasitic capacitance by utilization of silicon dioxide rather than silicon nitride as the masking and sidewall material.

Fourth, this processing approach provides an opportunity to improve the average and standard deviation of the DRAM device pause by elimination of one of the known causes of pause degradation. The process also provides an opportunity to perform special pause improvement process steps prior to sealing the single crystal silicon (moat) regions. Pause degradation is known to be due to silicon lattice damage and other lattice disruption. Since no contact etching comes in contact with the moat regions the normal degradation due to this process is eliminated.

Using the preferred embodiment of the present invention, oversized bit line contacts and undersized bit line are used. These elements in the contact region are sized for the proven production device design (layout) and Design Registration Accuracy (DRA) capability inherent in the present pattern and etch tool set. With an alternate layout the cell size can be decreased with the current DRA capability. As the DRA capability is improved the cell size can be decreased.

It should also be noted that no changes to the standard ion implantation strategy are needed. All diffused regions are defined prior to the application of the polysilicon pad. Finally, since the polysilicon pad is applied after all ion implantation processes, the moat sealing and polysilicon landing pad formation can be integrated into the periphery circuit processing without other process modifications. The polysilicon pad is a satisfactory structure for interconnect contact connection after the cell processing.

The example embodiment of the new SAC structure uses a 2 transistor cell with common active region (Bit line contact) a separate storage node contacts. This invention can be equally implemented in a single transistor structure.

BRIEF DESCRIPTION OF THE DRAWINGS

The above features of the present invention will be more clearly understood from consideration of the following descriptions in connection with accompanying drawings in which:

FIG. 1b is a schematic diagram of the device of FIG. 1a;

FIGS. 3–12 are cross-sectional views of a device after various process steps of the present invention;

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1A:
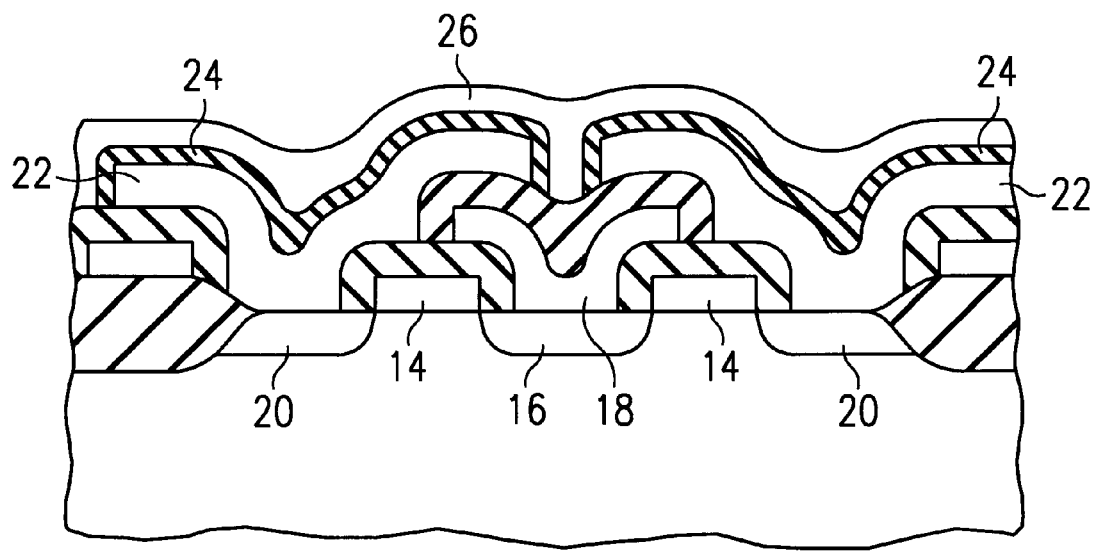
FIG. 1a is a cross-sectional view of a prior art DRAM device.
Figure 1B:
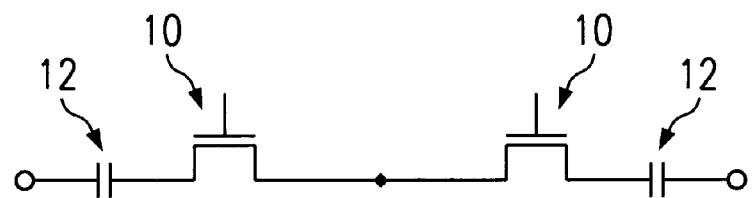

The present invention relates to a method for forming a dynamic random access memory (DRAM) cell. FIG. 1a illustrates two prior art DRAM cells, each of which includes a capacitor 12 coupled in series with a transfer transistor 10. FIG. 1b is a schematic diagram of the DRAM cells of FIG. 1a.

Referring now to FIGS. 1a and 1b together, each DRAM cell includes a pass transistor 10 coupled in series with a capacitor 12. The gate 14 of pass transistor 10 comprises one of the word lines WL of the memory array. (A memory array will be described in more detail with respect to FIG. 2a). A shared source/drain region 16 of each pass transistor 10 is coupled to bit line 18. The other source/drain region 20 is coupled to the storage node electrode 22 of capacitor 12. Capacitor 12 further includes dielectric layer 24 and cell plate 26.

Figure 2A:
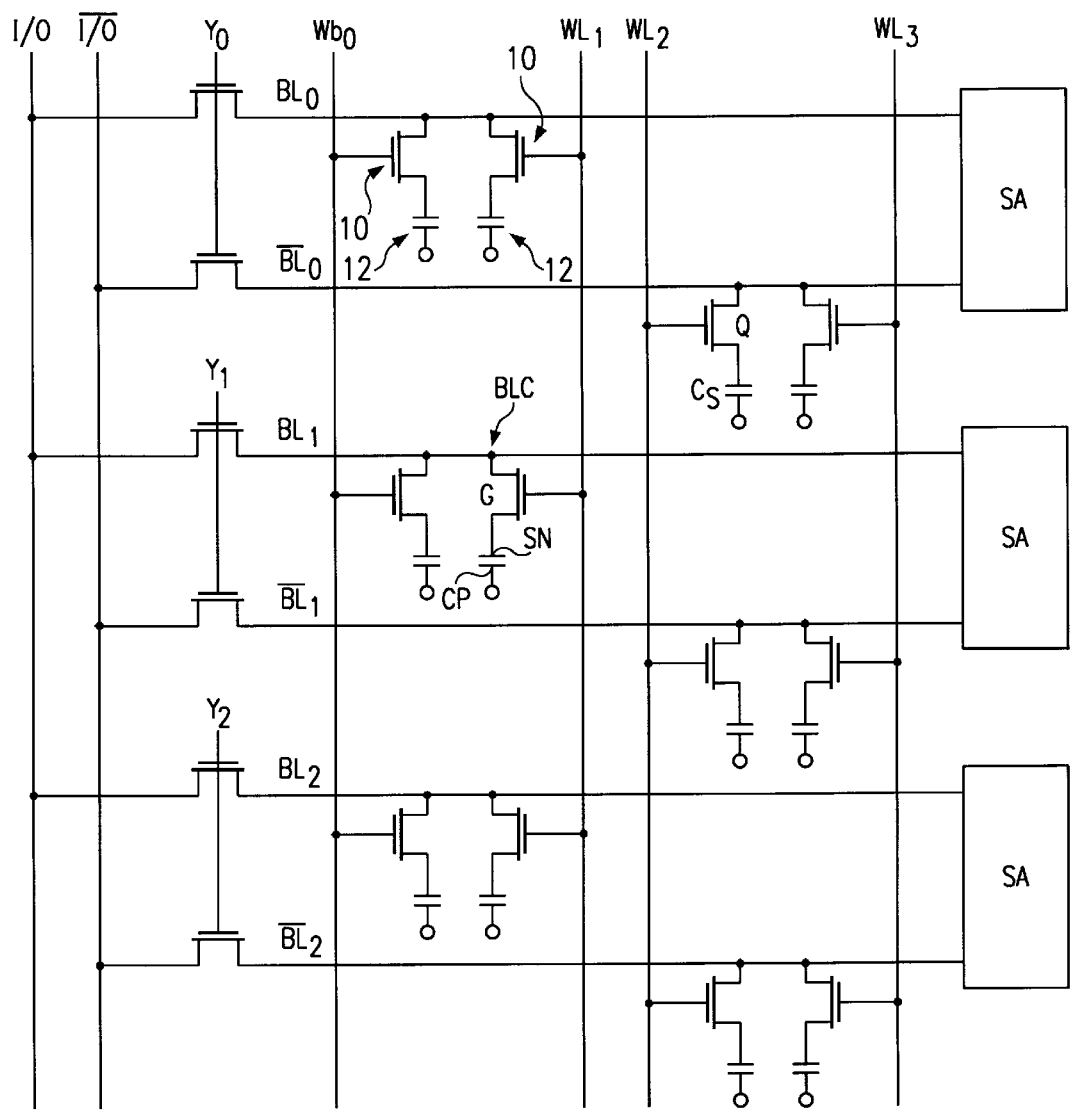
FIG. 2a is a schematic diagram of an array of DRAM cells.

A simplified schematic diagram of a DRAM array is illustrated in FIG. 2a. As shown, a plurality of memory cells can be formed in an array of rows and columns. FIG. 2a illustrates only six bit lines BL and for word lines WL in what in actuality would likely be a much larger array. The pass transistor Q of each memory cells has a gate G coupled to a word line WL and a source/drain region BLC (for bit line contact) coupled to a bit line BL. The transfer gate G of one pass transistor Q will be electrically coupled to the word line WL for a number of other pass transistors.

FIG. 2a also illustrates some of the peripheral circuitry, which would be included in a memory array. For example, each pair of bit lines BL and BL (bar) is coupled to a sense amplifier SA. The bit lines BL and BI (bar) are also coupled to input/output lines I/O and I/O (bar) through select transistors $Y_0$–$Y_2$. Other peripheral circuitry such as the row decoders, column decoders, address buffers, I/O buffers and so on is not illustrated here. For the purpose of this invention, the memory cell and fabrication method area independent of the memory architecture.

As an example, the memory array can be designed as an asynchronous memory or as a synchronous memory. A synchronous memory can be timed with an internal clock (not shown) or an external clock (not shown). The device can have a single external data terminal or multiple external data terminals (i.e., wide word). The array can include a total of 4 megabits, 16 megabits, 64 megabits, 256 megabits, one gigabit or more.

Figure 2B:
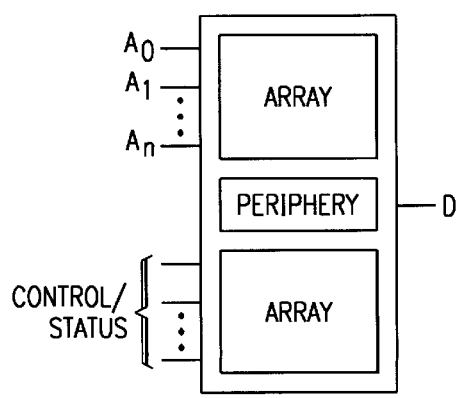
FIGS. 2b–2c are block diagrams of two embodiment DRAM devices.

A simplified block diagram of a memory device is shown in FIG. 2b. The internal device circuitry includes an array and peripheral circuitry. The array may be divided into a number of blocks depending upon the device architecture. Sense amplifiers may be interleaved within the array blocks.

Several external terminals are illustrated in FIG. 2b. Address terminals $A_0, A_1, \ldots, A_n$ are provided for receiving row and column addresses. These terminals may be multiplexed (i.e., a first address is applied at a first time and a second address applied at a second time). A single data terminal D is also illustrated. This terminal may comprise an input, an output or an input/output. Other data terminals may also be included. For example, a wide word device will have multiple data terminals. In general, these terminals are provided for receiving input signals from circuitry (not shown) external of the array and for providing output signals to circuitry (not shown) external of the array.

FIG. 2b also illustrates a number of control/status signals. These signals are used to operate the memory device. For example, an asynchronous memory device may be operated by applying chip select, row address strobe and column address strobe signals. Other signals may indicate whether a read or write operation is being performed. In a synchronous device, one of the control signals may be a clock signal. Status signals may provide information about the device to the external system. For example, the device may include a signal indicating whether a refresh operation is taking place or which portion of the array is being accessed.

Figure 2C:
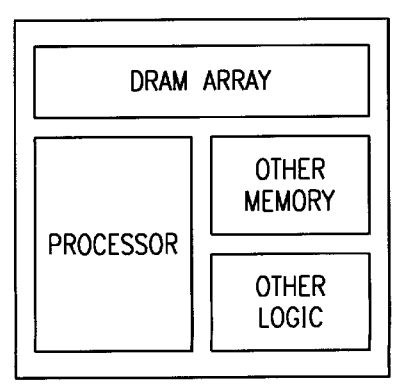

A memory array of the present invention could also be embedded in a larger integrated circuit device. An embedded memory is a memory array and its associated control circuit on the same integrated circuit as a substantial amount of logic. FIG. 2c has been included to illustrate a simple block diagram of an embedded memory. In this example, a DRAM array is included along with a processor (e.g., microprocessor, digital signal processor, specialty processor, microcontroller), another memory array (e.g., SRAM, non-volatile memory such as EPROM, EEPROM, flash memory, PROM, ROM, another DRAM array) and other logic circuitry. These particular blocks have been chosen to illustrate the wide variety of other logic, which could be included. Any combination of the devices could be included.

As related to a DRAM as shown in FIG. 1a, the present invention pertains to a novel method for forming self-aligned contacts. A first embodiment of the present invention will be described with respect to FIGS. 3–12.

Figure 3:
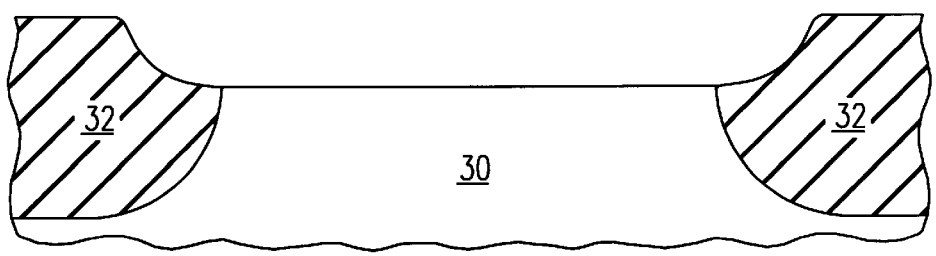

Referring now to FIG. 3, a semiconductor region 30 is provided. In the preferred embodiment, semiconductor region 30 comprises a p-doped silicon substrate. Other semiconductor regions could also be used. For example, n-doped silicon substrate can be used. While illustrated as a substrate, semiconductor region 30 could alternatively be an epitaxially grown layer, a region within a region such as a well, a tank or a tub, a semiconductor layer over an insulating layer (e.g., S.O.I.) or just about any other semiconductor region.

Field isolation regions 32 are also illustrated in FIG. 3. In the preferred embodiment, field oxide regions 32 are formed by the known LOCOS (local oxidation of silicon) process. In the process, a thin nitride layer (not shown) is blanket deposited over the substrate and then patterned to expose the areas where the field oxide 32 will be formed. These exposed regions are then oxidized. In alternative embodiments which are illustrated, other isolation techniques such as trench isolation or field plate isolation can be used.

Figure 4:
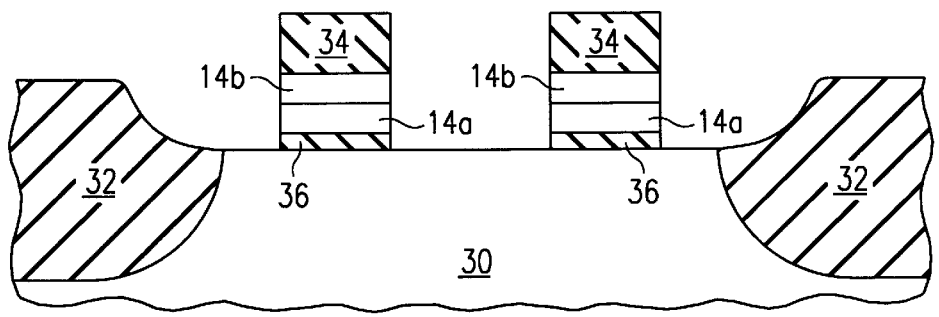

Referring to FIG. 4, transfer gates (word lines) 14 are formed. In this embodiment, each transfer gate is a conductor formed by a layer of doped polysilicon 14a with a layer of tungsten silicide 14b overlying to lower the resistance. Transfer gate 14 is separated from substrate 30 by gate insulating layer (e.g., oxide, nitride, oxide-nitride stack) 36. In other embodiments, transfer gate 14 can be formed from other materials such a titanium silicide/poly, moly disilicide/poly, doped poly only, or tungsten/poly films could be used. For the sake of simplicity, the figures only show the word lines 14 for two pass transistors. It is noted, however, that word lines for memory cells not illustrated would also be formed simultaneously (see FIG. 1a). An insulating layer 34, preferably an oxide, is formed over each transfer gate 14.

In the preferred embodiment, transfer gates 14 are formed by sequentially depositing layers of polysilicon, tungsten silicide and then the insulator. These layers are then patterned using standard photolithography and etched.

Figure 5:
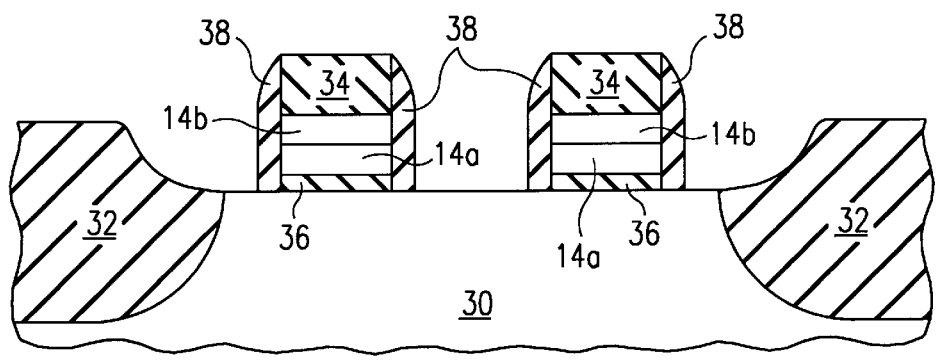

After definition of the moat (active device area) and the transfer gate 14(cell word line), a low dielectric constant silicon dioxide sidewall 38 is applied to transfer gate 14. This step is illustrated in FIG. 5. In other embodiments, a different material can be used for sidewall 38. For example, nitride sidewall regions 38 are envisioned.

The sidewall regions can be formed by blanket depositing an insulating layer such as silicon dioxide over the device. The layer can be anisotropically etched so that sidewall insulating regions 38 remain. Sidewall insulating region 38 along with insulating layer 34 will surround transfer gate 14.

Figure 6:
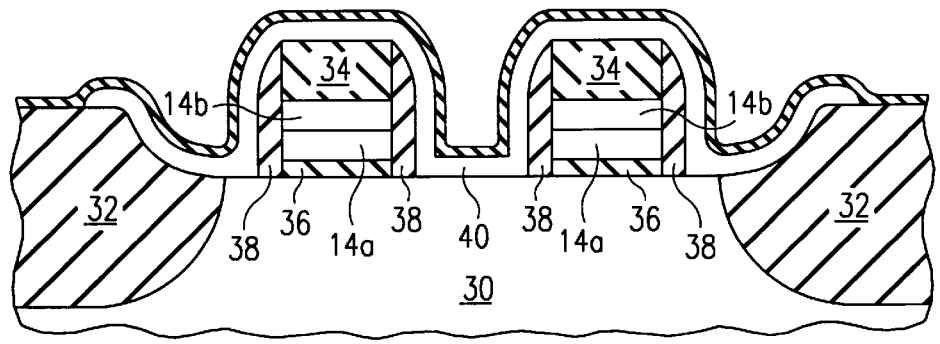

Referring now to FIG. 6, a common conductive layer 40 is formed over the exposed moat regions and overlaps onto transfer gate 14 and field oxide regions 32. In the preferred embodiment, conductive layer 40 comprises doped polysilicon but other materials could alternatively be used.

Masking layer 42 is formed over the conductive layer 40. In the preferred embodiment, this step entails depositing a layer 42 of silicon dioxide. In other embodiments, other materials could alternatively be used.

Referring now to FIG. 7a, a portion of masking layer 42 is removed so as to expose a portion of conductive layer 40 over a bit line contact region 44 within substrate 30. This step will also expose portions of both of the transfer gates 14 which are adjacent to the bit line contact region 44. This oversized contact window 41 is opened for the bit line contact (formation of bit line 18 will be illustrated in FIG. 8a). A plan view of the device is shown in FIG. 7b.

The contact window is an oversized window when it is patterned without using the minimum photolithographic distance. For the purpose of this patent, the minimum photlithographic distance is the smallest dimension that can be patterned using a given photolithography system. Since the contact window overlaps adjacent transfer gates 14, there is no need to be confined to the photolithographic minimum distance. This capability provides an advantage since very precise patterning is not necessary. This capability also provides a further advantage in that the process is scalable. As future generations attempt to pack more memory cells into a smaller area, the contact window can be scaled to smaller dimensions. In this manner, higher density memories can be formed using the same processing steps, possibly by patterning contact window 41 at a photolithographic minimum distance.

Referring now to FIG. 8a, bit line 18 is formed. After deposition of the bit line film(s) (e.g., polysilicon 18a and tungsten silicide 18b), bit line 18 is patterned and etched. The bit line pattern is undersized in the contact region to allow unwanted portions of the conductive layer 40 to be removed. In other words, the bit line layer is patterned and etched to expose a portion of conductive layer 40 between masking layer 42 and bit line 18. The exposed portion of conductive layer 40 is then removed using masking layer 42 as a mask (along with a patterned photoresist layer over bit line 18, which is not illustrated). This way the bit line contact portion 40a of conductive layer 40 is electrically isolated form the remainder of conductive layer 40.

Figure 8B:
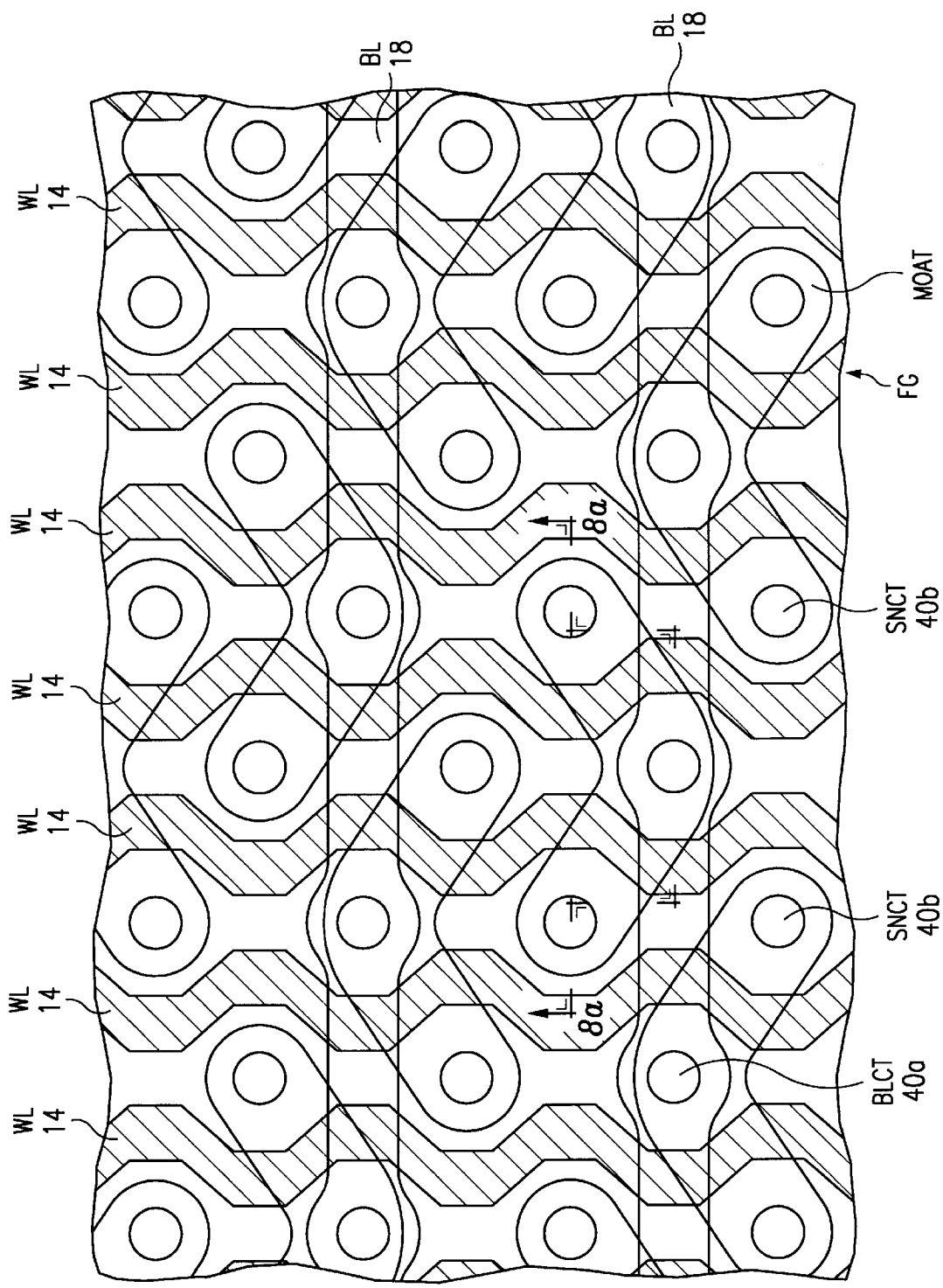

FIG. 8b illustrates a plan view of the device. Several memory cells are included in this view. As illustrated in this figure, the contacts 40a and 40b are symmetric and than can be printed with alternating phase shift. The moat symmetry should be sufficient to be printed with alternating phase shift as is now done with other processes. With the present invention, however, the packing density (i.e., the number of memory cells in a given area) should be higher.

Figure 9:
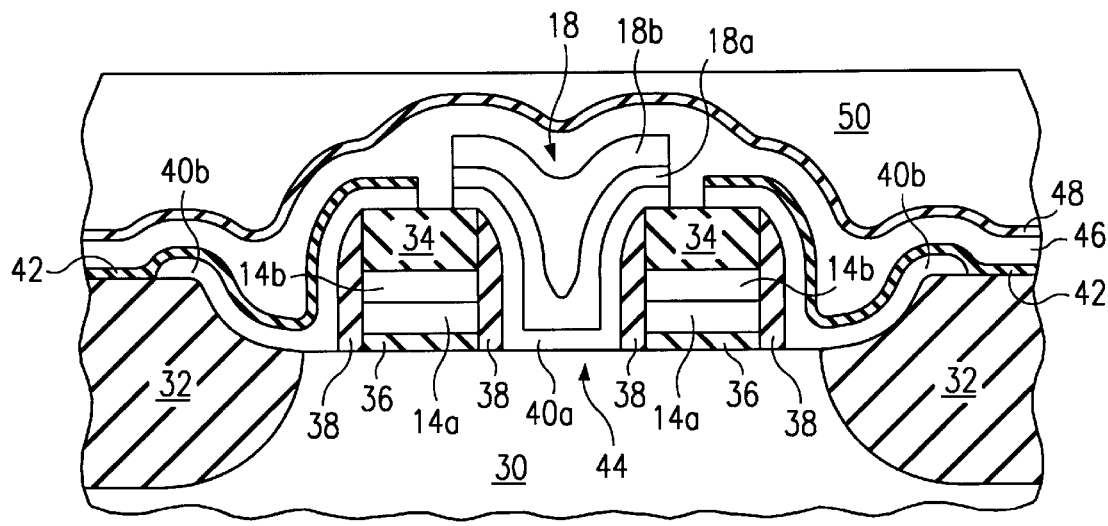

Referring to FIG. 9, an insulating layer 46/48/50 is formed over the device. In the preferred embodiment, a multilayer insulator is formed. First, a deposited oxide layer 46 which can be formed by the decomposition of tetraethyloxysilane (TEOS). Next a nitride layer 48 is deposited. Then a planarizing film such as BPSG (borophosphosilicate glass) layer 50 is formed.

Figure 10:
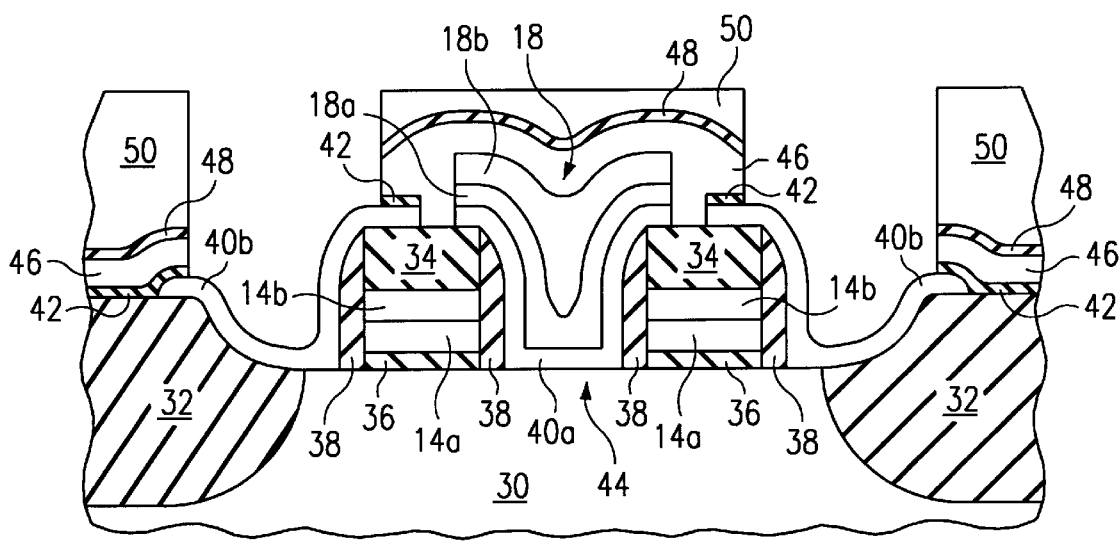

Referring next to FIG. 10, storage node contact holes are opened. A photoresist layer (not shown) is applied to the device and patterned to expose a portion of the BPSG layer 50 over the storage node contact region. The multilayer insulator 46/48/50 is then etched to expose a storage node contact portion 40b of conductive layer 40.

Figure 11:
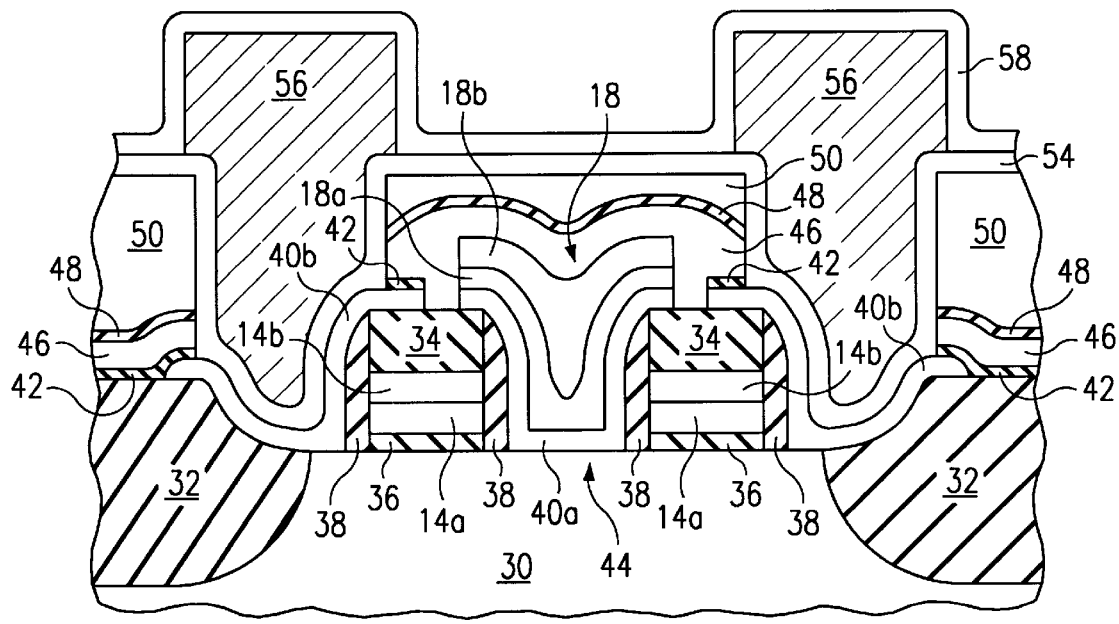
Figure 12:
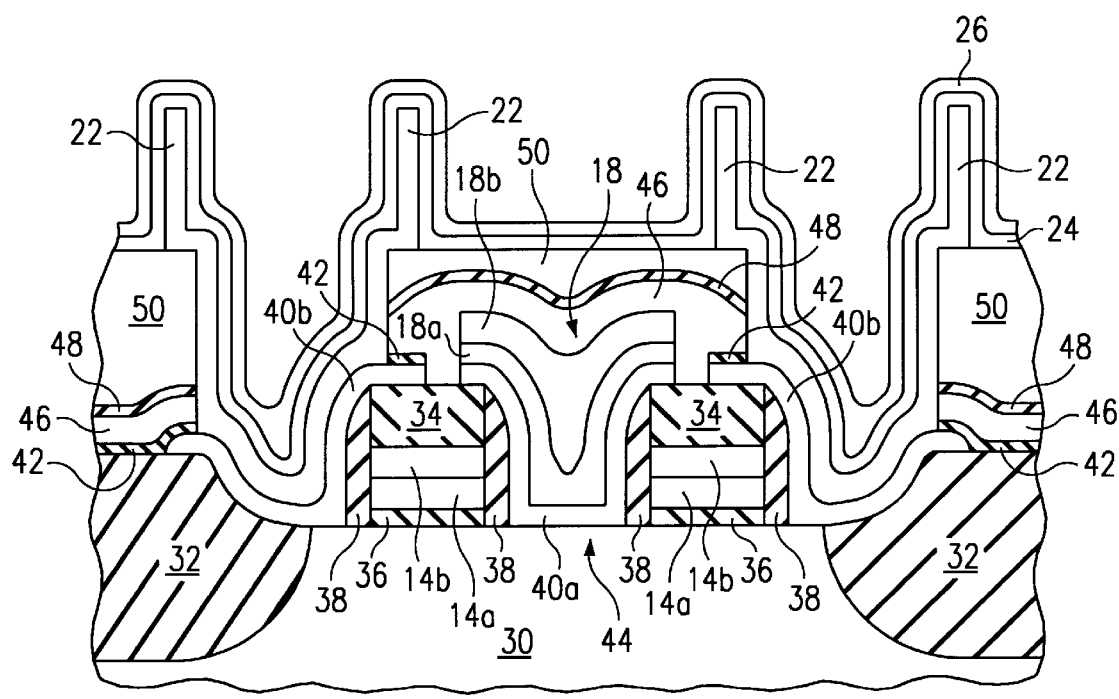

One method of forming storage node 22 is illustrated in FIGS. 11 and 12. Referring first to FIG. 11, a conductive layer 54 such as doped polysilicon is formed over the device. The conductive layer 54 abuts the storage contact portion 40b of conductive layer 40. Next, sacrificial regions 56 are formed over the storage node contact. Another conductive layer 58, preferably of the same material as conductive layer 54, is formed over sacrificial region 56 and conductive layer 54.

An anisotropic etch can then be performed. This etch will remove the exposed portions of layers 54 and 56 leaving conductive sidewalls along sacrificial region 56. Once sacrificial region 56 is removed, as shown in FIG. 12, a crown-shaped storage node electrode 22 remains. Dielectric layer 24 and cell plate conductor 26 can then be formed over storage node conductor 22. As examples, dielectric layer 24 can be an oxide/nitride/oxide layer or a layer of higher dielectric constant material such as tantalum pentoxide, barium strontium titanate, or lead zirconium titanate.

The memory cell will be completed by forming a capacitor dielectric 24 and a cell plate electrode 26 over the storage node 22. Other steps would also be performed but, for the sake of simplicity, will not be illustrated here. For example, several layers of insulators and metal interconnects could be formed in order to properly interconnect the various circuits within the memory device. The device will also be tested and packaged. Steps such as these are known in the art and need not be described here.

Figure 13:
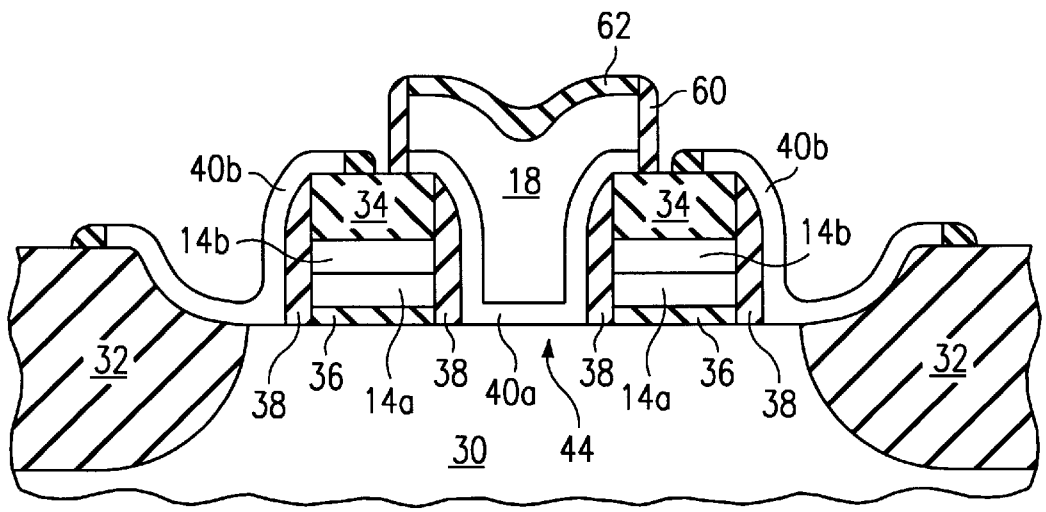
FIGS. 13–15 are cross-sectional views of a device after various process steps of an alternate embodiment of the present invention.
Figure 14:
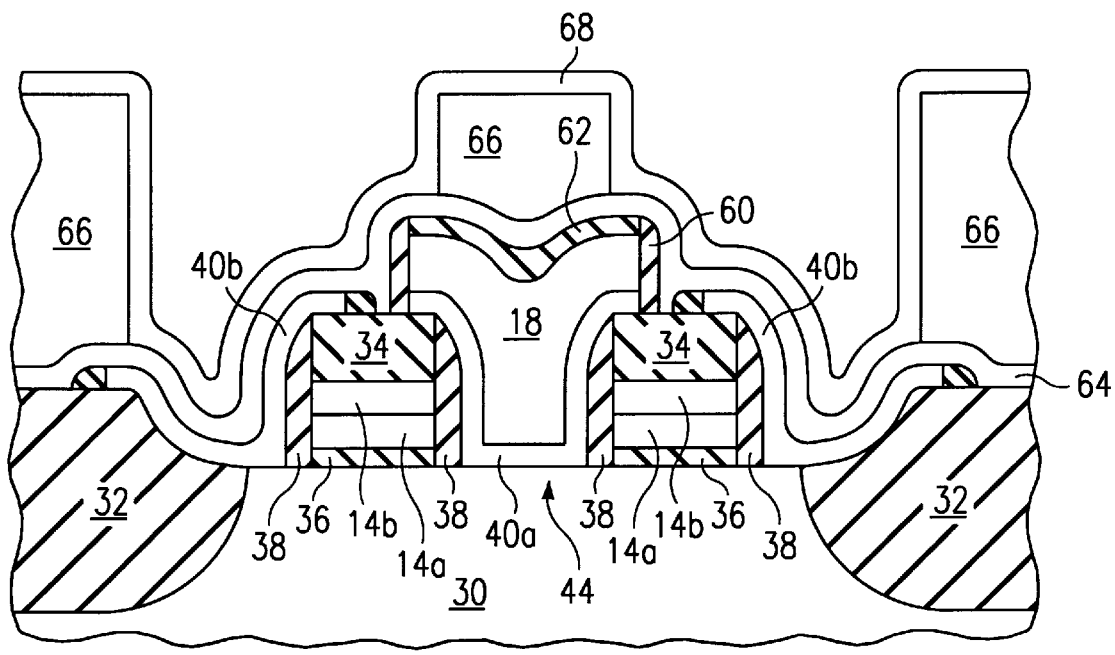
Figure 15:
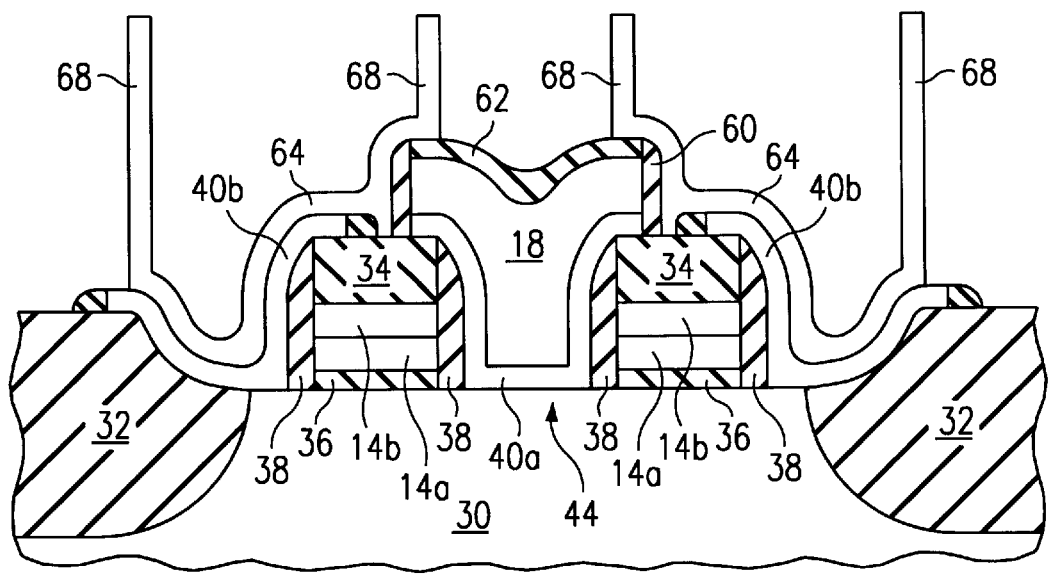

Several modifications of the present invention are possible. FIGS. 13–15 illustrate one such modification. The cross-sectional view of FIG. 13 is taken after additional processing is performed on the structure of FIG. 8a. Specifically, a sidewall 60 is formed along sidewalls of bit line 18. The sidewall is preferably formed from an oxide material. The oxide sidewall 60 is formed by depositing an oxide layer and then etching back. The etch back step will also clear the oxide layer 42 over the storage node pad 40b.

During the sidewall 60 formation, an insulating layer 62 will be formed over the bit line 18. This insulating layer 62 is preferably a low dielectric constant material such as an oxide. While nitride could alternatively be used, this material is not preferred since it will increase the capacitance between bit line 18 and other conductors (not shown).

The storage node contact pad 40b is opened without a pattern step and then the storage node polysilicon (or other conductor) layer 64 is deposited as shown in FIG. 14. Sacrificial regions 66 are then formed over the conductive layer 64. These regions 66 were formed by depositing a thick planar material (e.g., oxide BPSG) and selectively etching. It is noted that unlike sacrificial region 56 of FIG. 11, sacrificial region 66 is patterned to expose rather than cover the storage node contact areas.

Another conductive layer 68, preferably of the same material as conductive layer 64, is formed over sacrificial region 66 and conductive layer 64. As the previously described embodiment, an anisotropic etch can then be performed. This etch will remove the exposed portions of layers 64 and 66 leaving conductive sidewalls along sacrificial region 66. Once sacrificial region 66 is removed, a crown-shaped storage node electrode 22 remains. This structure is shown in FIG. 15.

Figure 16:
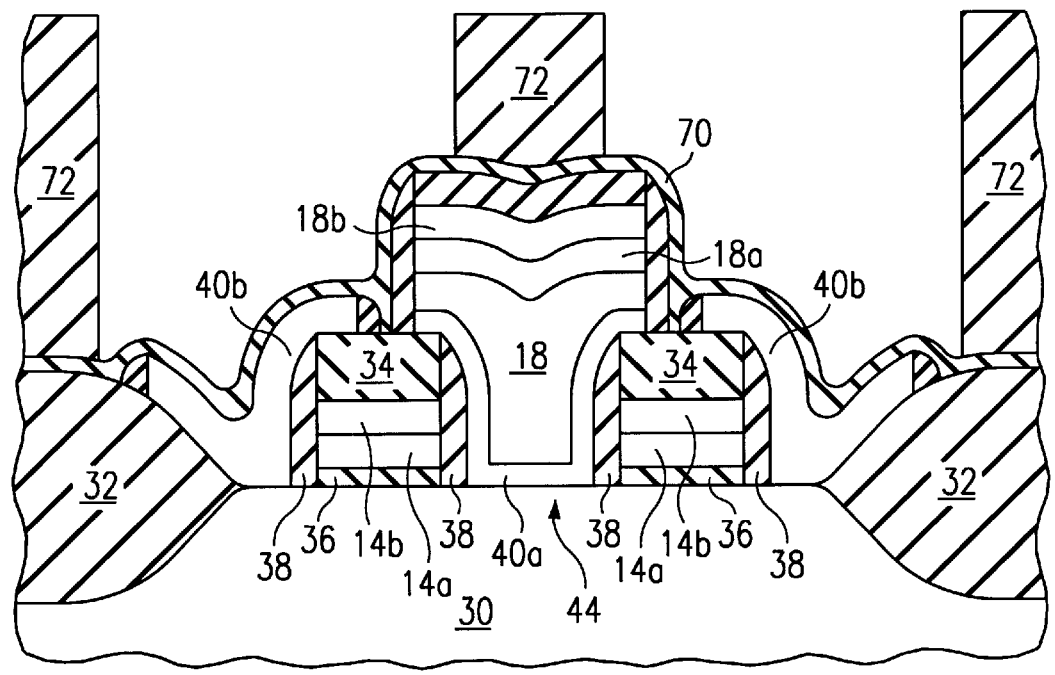
FIGS. 16–18 are cross-sectional views of a device after various process steps of a second alternate embodiment of the present invention.
Figure 17:
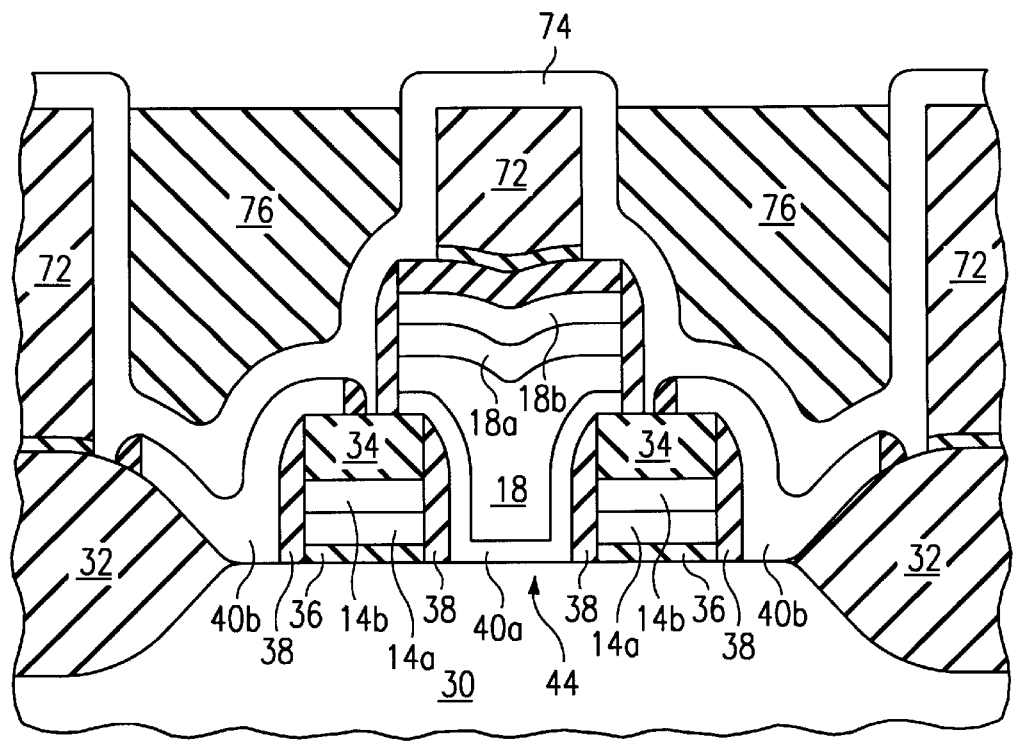
Figure 18:
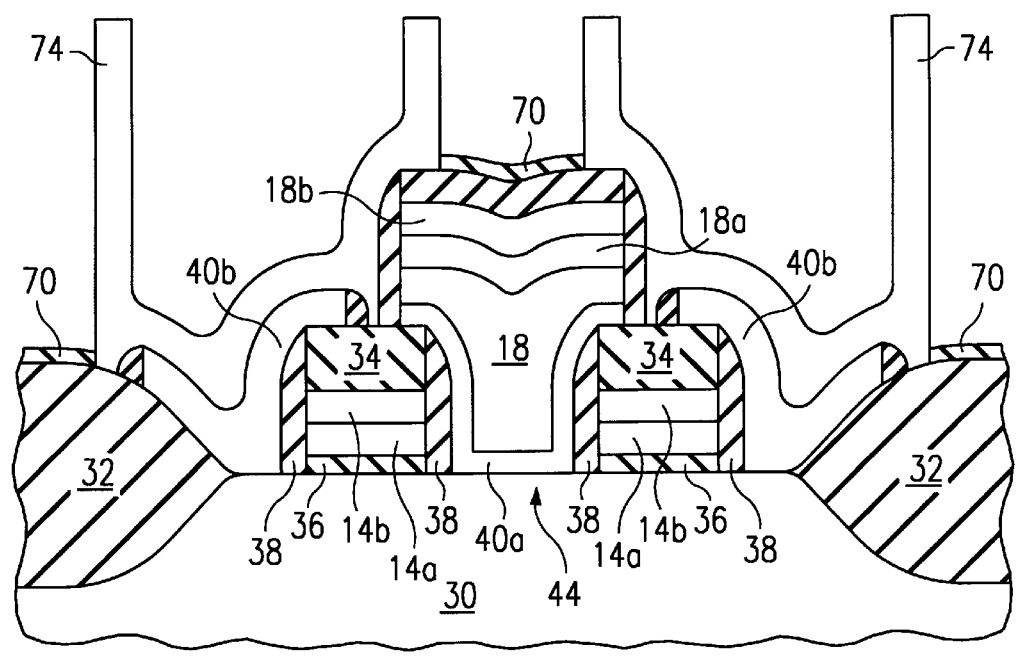

Another embodiment is illustrated in FIGS. 16–18 showing that some of the process steps could be modified yet again. For example, after the bit line sidewall 60 etch (FIG. 13), a nitride layer 70 could be deposited as shown in FIG. 16. A layer 72 of BPSG could then be deposited and etched back in order to planarize the upper surface. The BPSG 72 could then be patterned to expose the storage node contact pad 40b. This etch would be performed in two steps. First, there is an oxide etch which stops on nitride followed by nitride etch which stops on oxide. After the oxide 72 and nitride 70 are etched, the pad 40b cleaned.

Referring next to FIG. 17, polysilicon layer 74 could be deposited. Another BPSG layer 76 is then deposited and etched back to expose the polysilicon layer 74. The exposed portions of polysilicon 74 are then etched as shown in FIG. 18. During this etching step, the layer 76 protects the pad region. This polysilicon etch is preferably an end point etch followed by a deglaze to remove any thin oxide layers.

FIG. 18 illustrates the memory device after removal of the layers 72 and 76. The regions 72 an 76 are removed with the nitride layer 70 over bit line 18 serving as an etch stop. This etch stop layer will protect the bit line 18. Accordingly, the etch should be highly selective to oxide.

To complete the memory cell, a capacitor dielectric (not shown) and cell plate electrode (not shown) are formed over the storage node 22. As before, other processing steps will be performed to complete the memory device.

Figure 19:
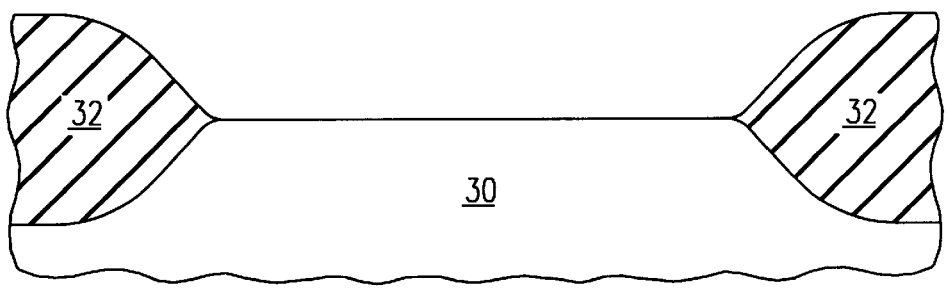
FIGS. 19–35 show further embodiments.
Figure 20:
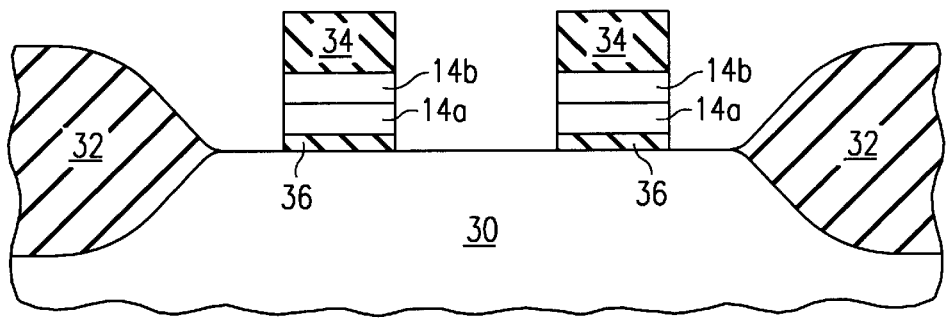
Figure 21:
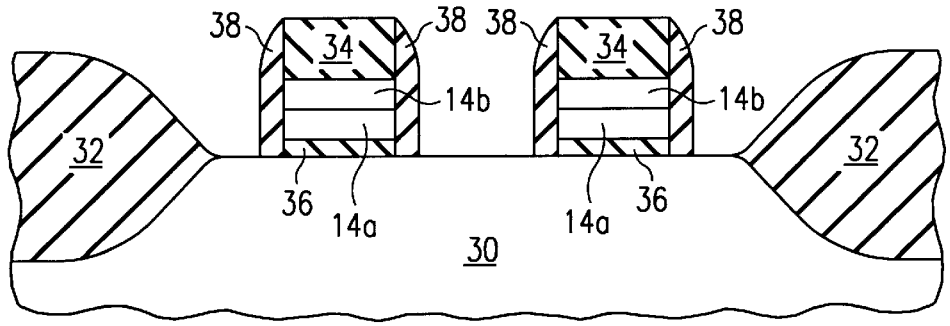
Figure 22:
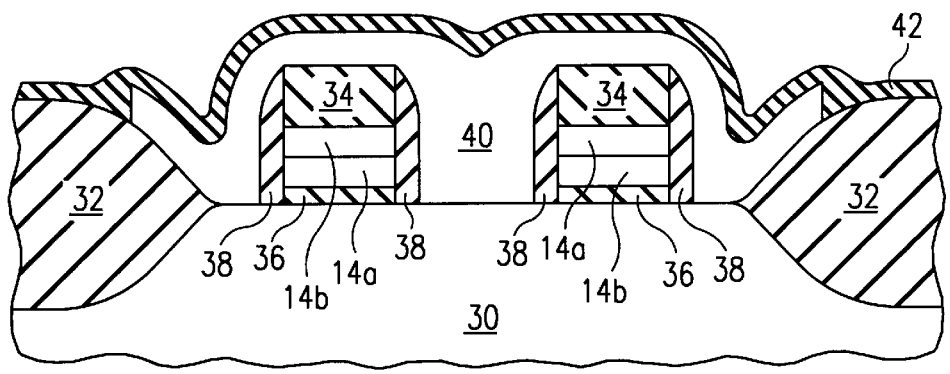

FIGS. 19–29 illustrate another embodiment. In particular, FIG. 19 shows filed isolation 32, FIG. 20 shows wordlines in cross sectional view made of nitride 34 on tungsten silicide 14b on polysilicon 14a on gate oxide 36. FIG. 21 illustrates sidewall oxide formed by conformal deposition and anisotropic etch. FIG. 22 shows deposited polysilicon 40, which has been patterned to remove the portion away from the moats and covered with deposited oxide 42.

Figure 23:
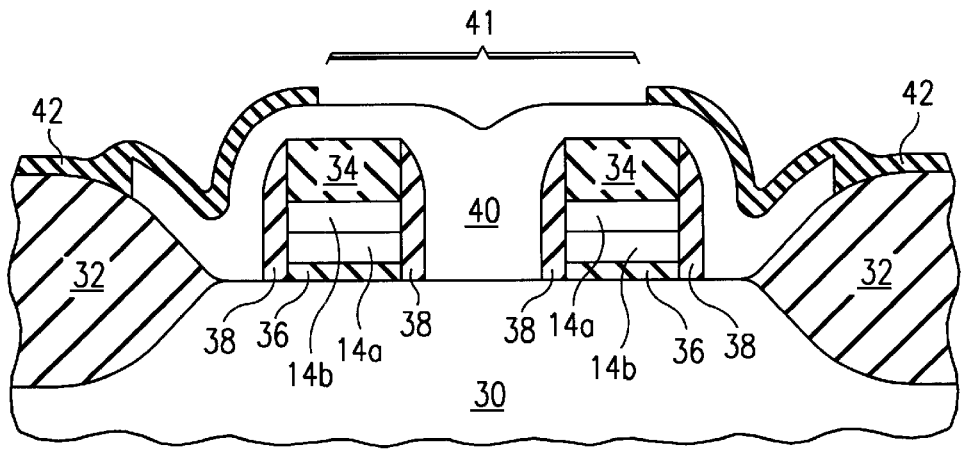
Figure 24:
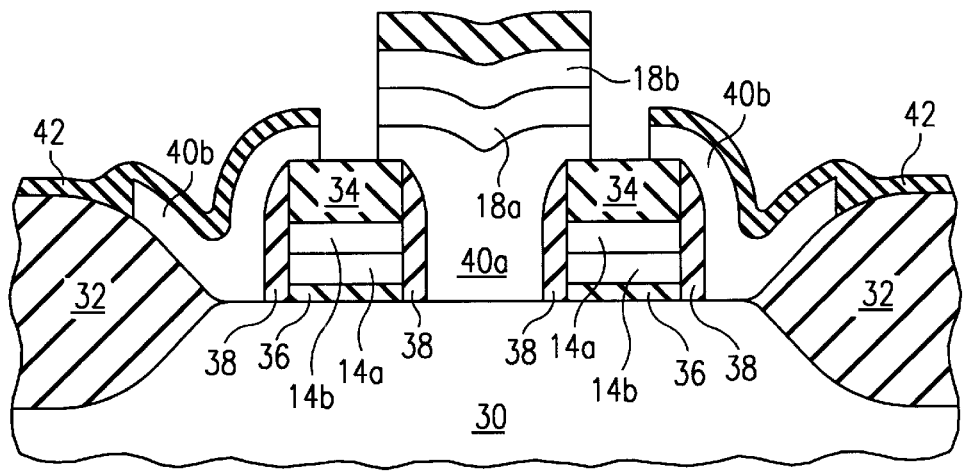

FIG. 23 shows oxide 42 patterned and etched by an oversize bit line contact pattern to expose polysilicon 40 in opening 41. Then blanket deposit layers of polysilicon (40 nm), tungsten silicide (120 nm), and oxide (100 nm). Next, pattern to define the bit lines and etch. The etch is multistep and the oxide (plus BARC if used) etch (fluorine-based plasma) stops on the tungsten silicide. The tungsten silicide plus polysilicon etch (chlorine-based plasma) stops on the nitride 34. Lastly, oxidize the exposed surfaces of the polysilicon and tungsten silicide; see FIG. 24, which shows tungsten silicide 18b on polysilicon 18a, which is on original polysilicon 40.

Figure 25:
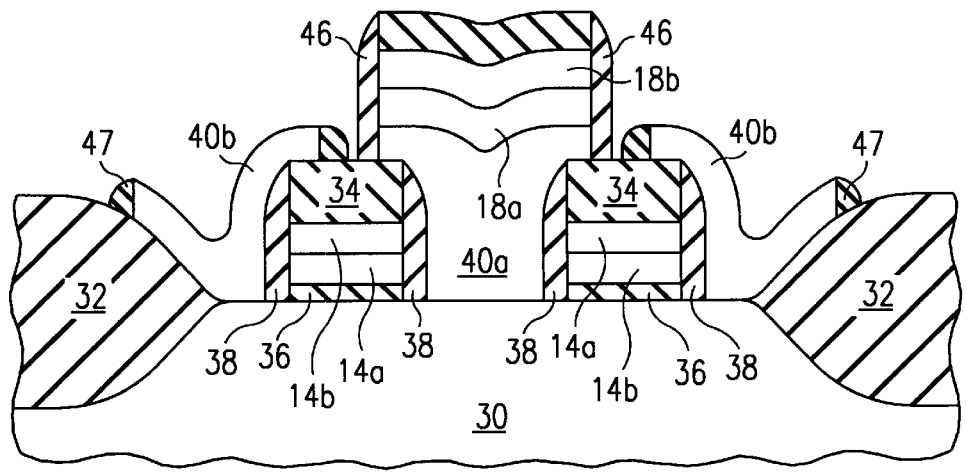
Figure 26:
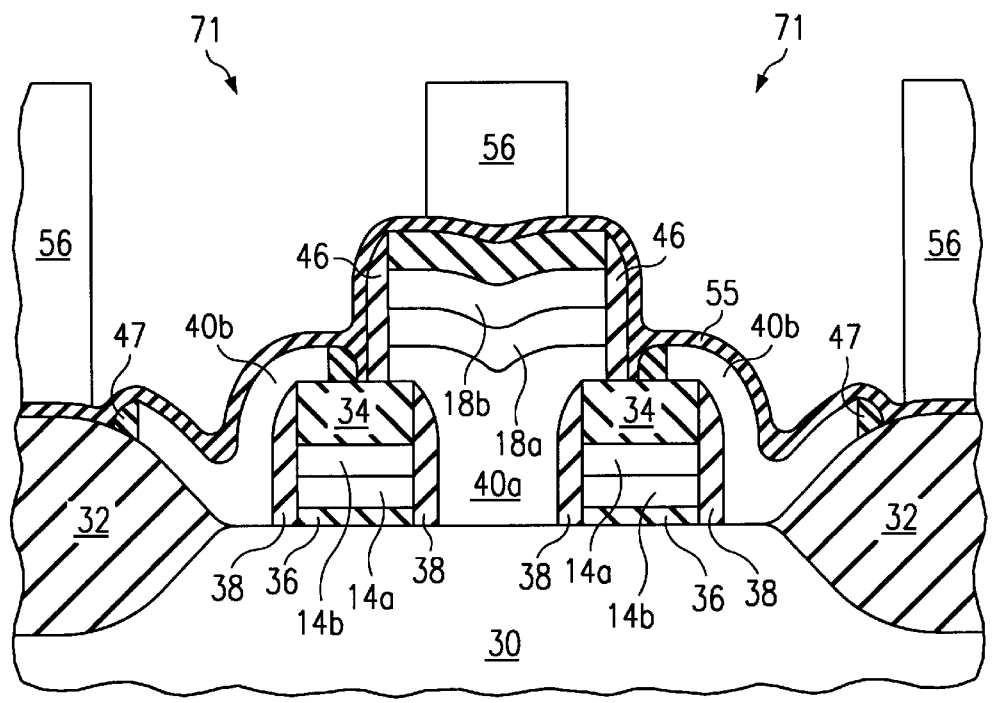

FIG. 25 shows the result of a blanket oxide deposition followed by anisotropic etching to form sidewall oxide 46 on the bit line plus sidewall oxide 47 on the portions of polysilicon 40 away from the bit lines. Note that the oxide on the surface of this portion polysilicon 40 is removed because it was not thick enough to survive the anisotropic etching.

Figure 27:
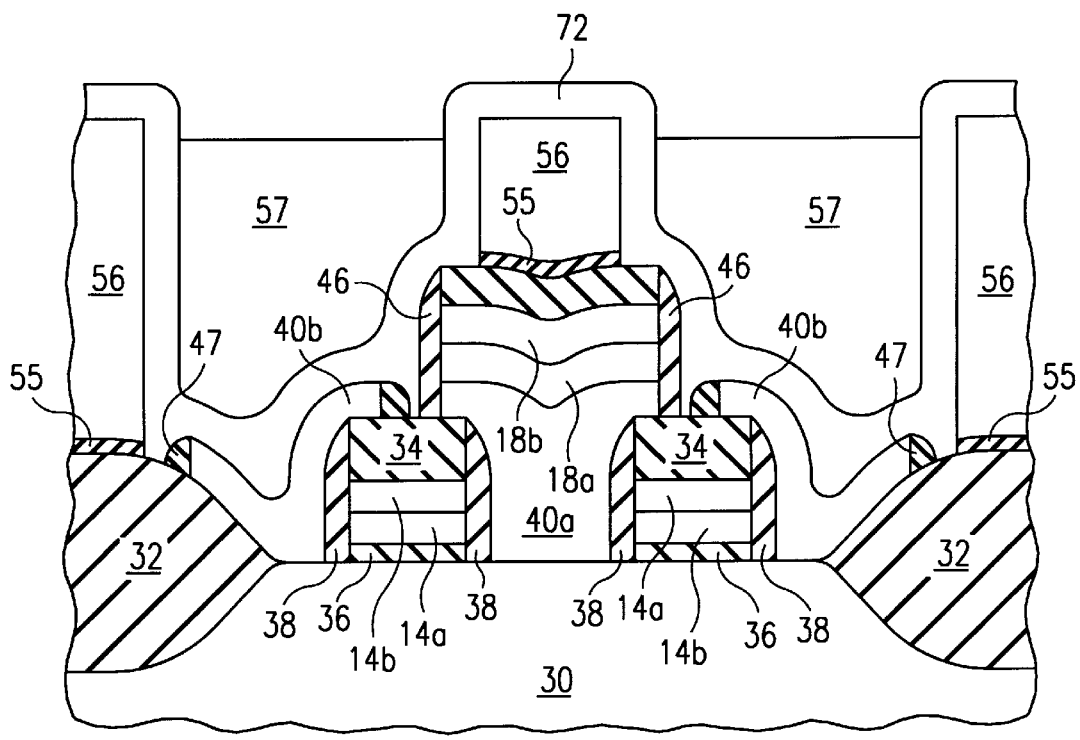
Figure 28:
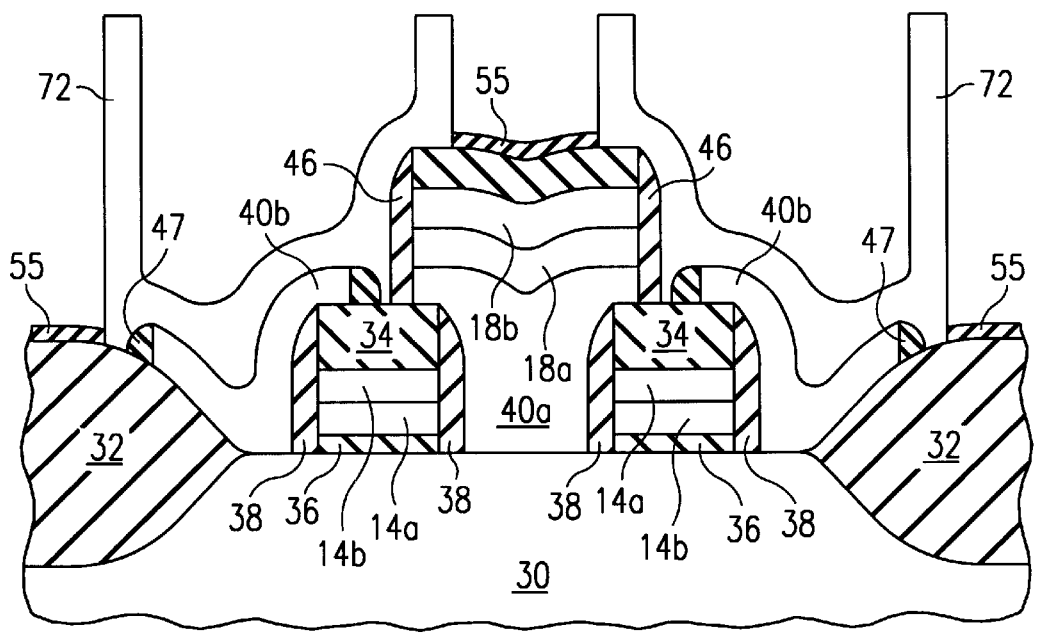
Figure 29:
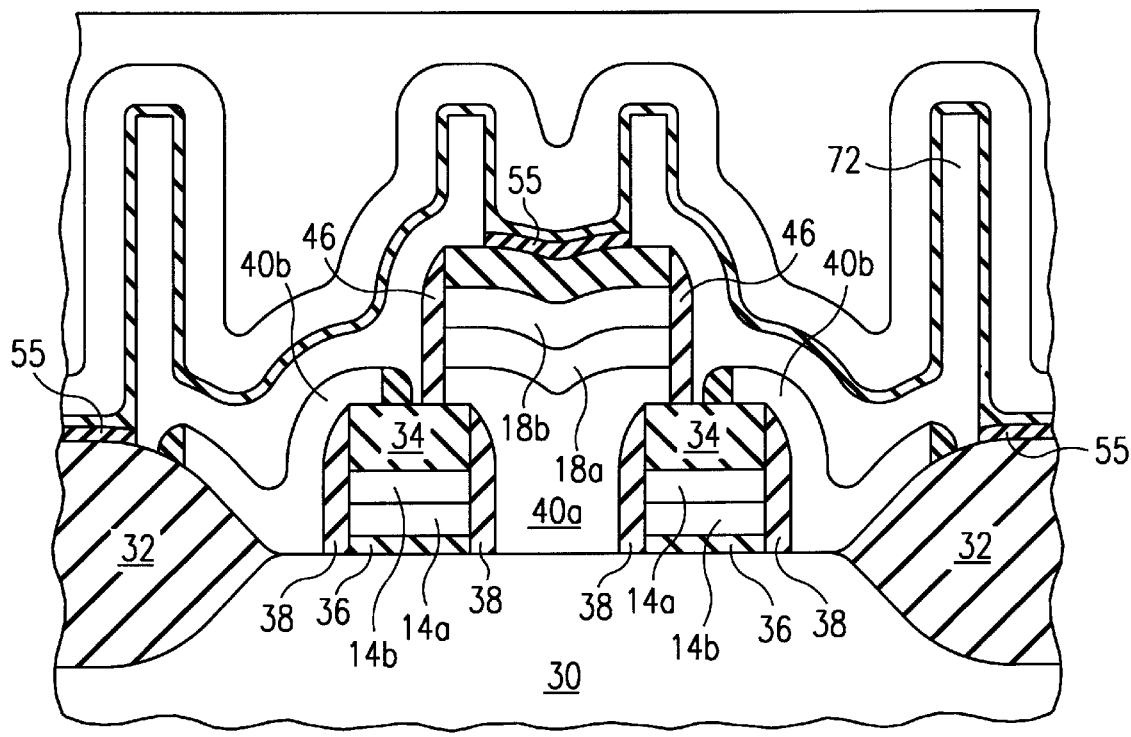
Figure 30:
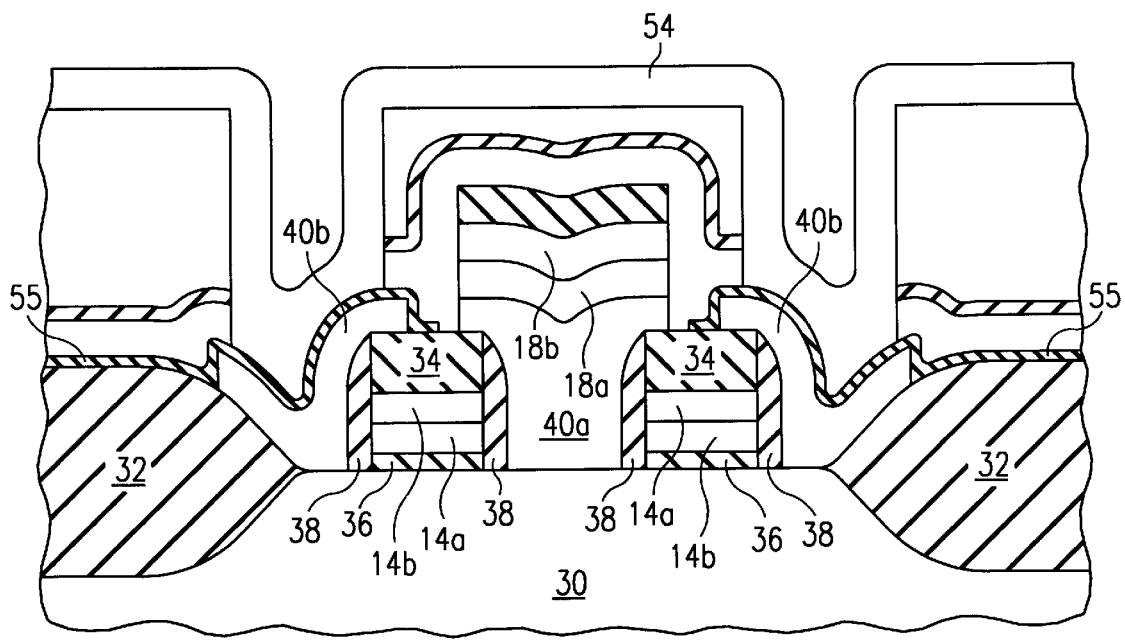
Figure 31:
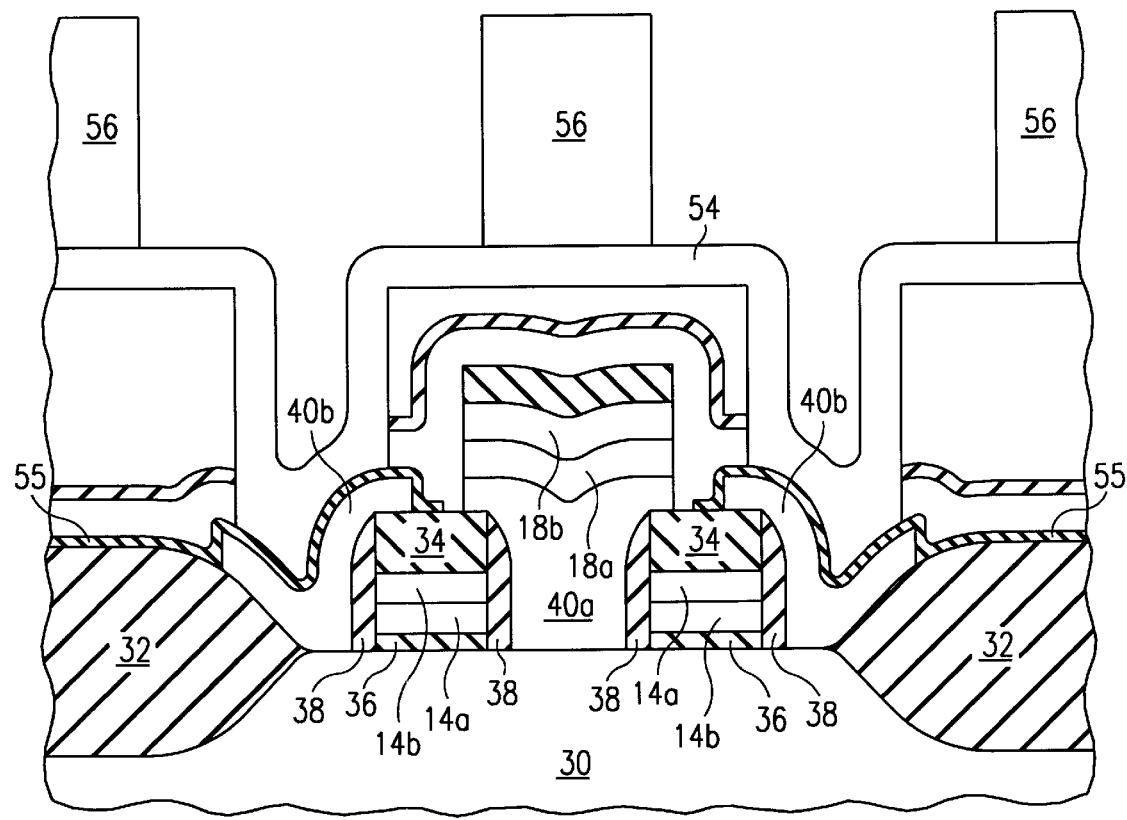
Figure 32:
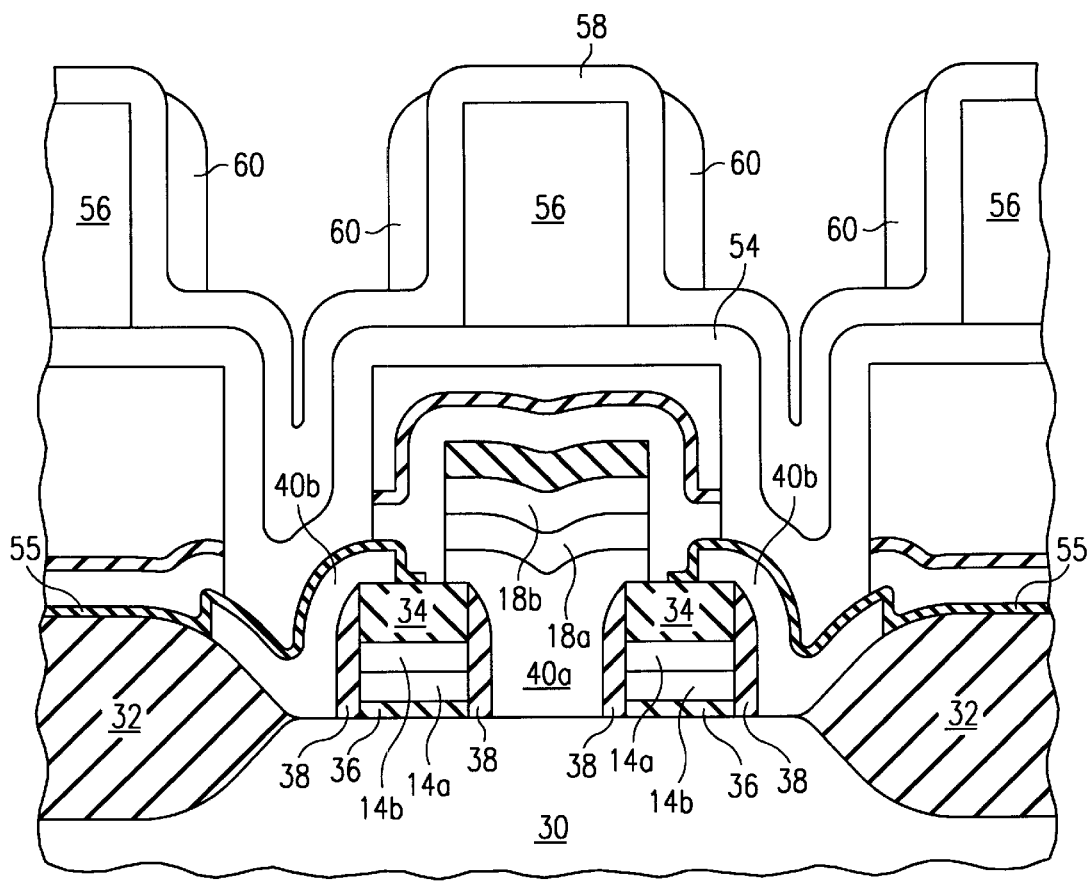
Figure 33:
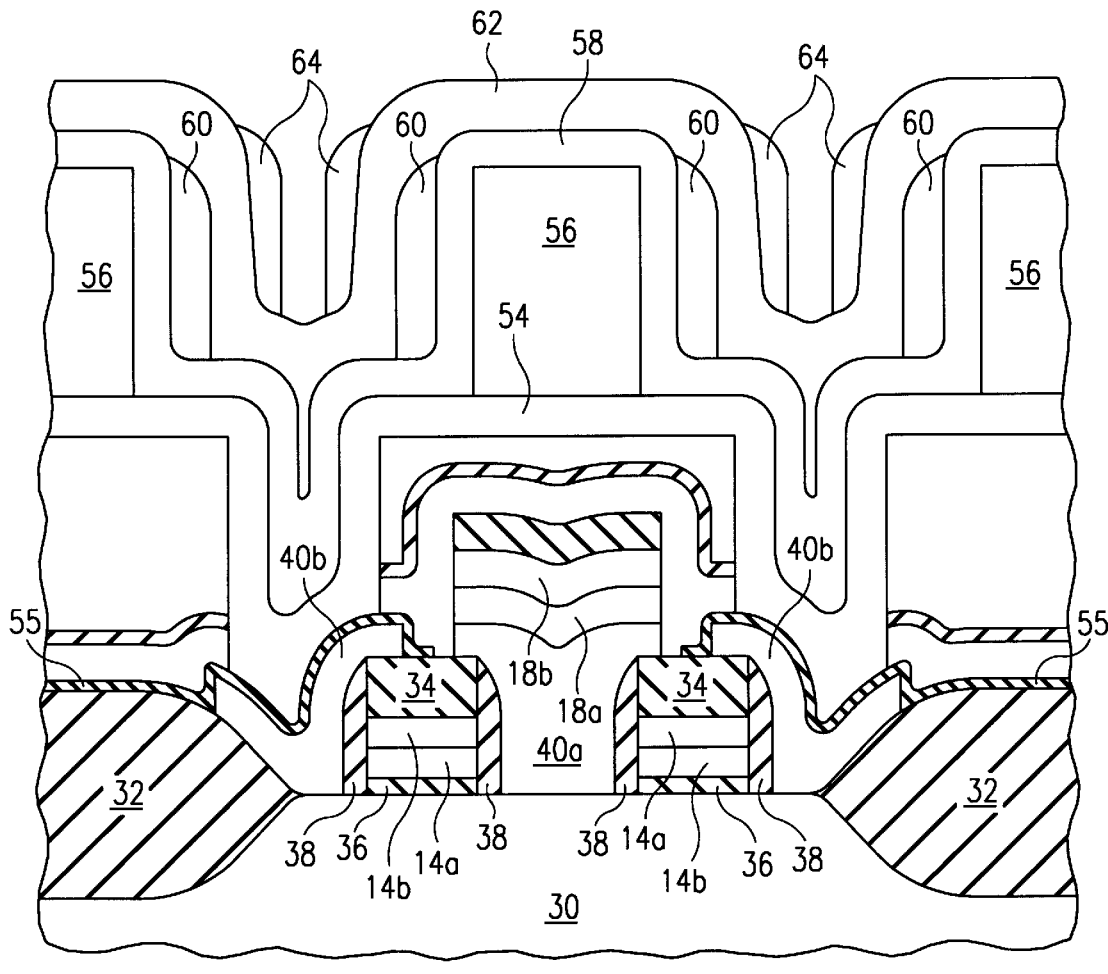
Figure 34:
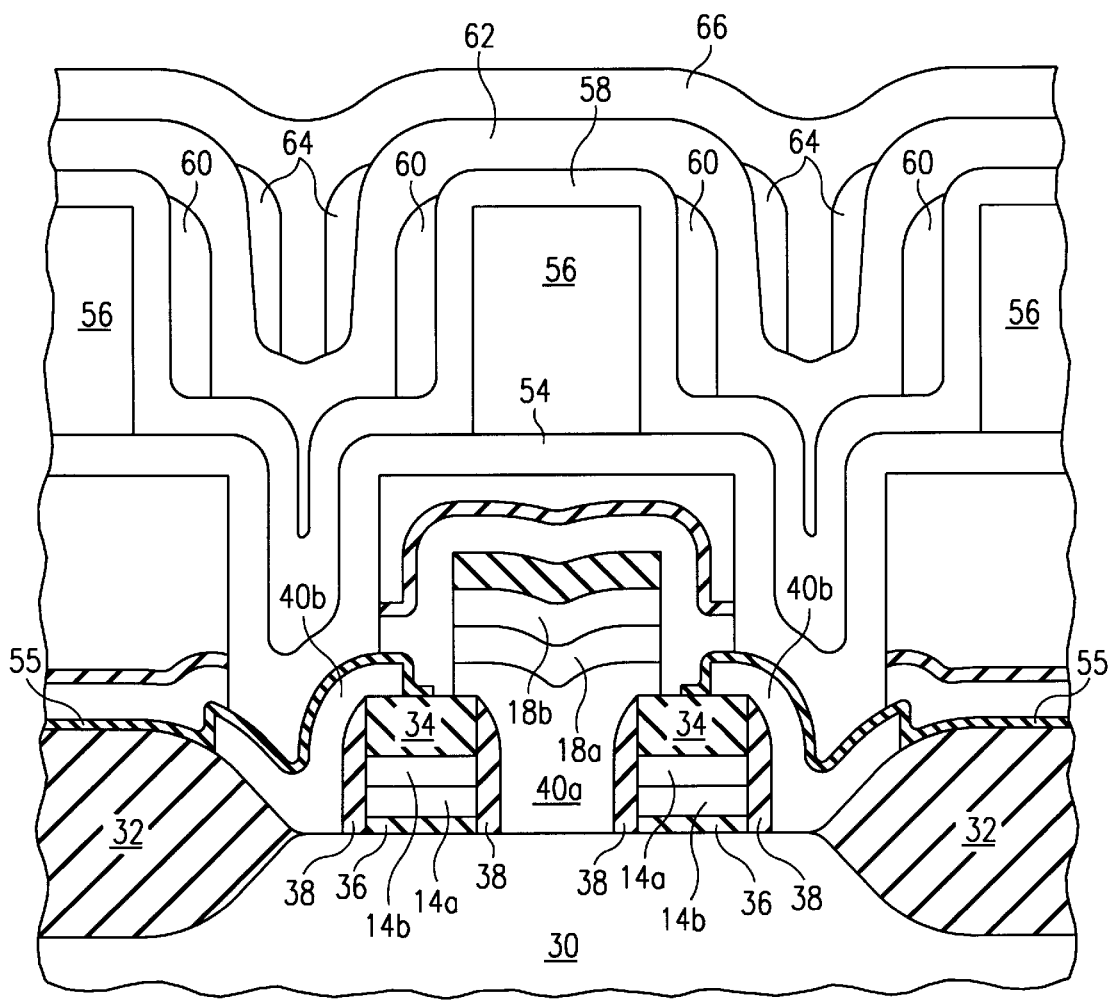

Next, deposit 25 nm nitride 55 and 550 nm BPSG 56. Etch back the BPSG for planarization and pattern etch to for openings 71 for eventual capacitors; see FIG. 26. Then etch the exposed portion of nitride 55 and deposit 100 nm thick polysilicon 72. Then deposit 400 nm of BPSG 57 and etch back; this leaves BPSG 72 in the openings as illustrated by FIG. 27.

Etch the exposed portion of polysilicon 72 to uncover BPSG 56; and then wet etch the BPSG 56–57. This leaves polysilicon 72 in the shape of a crown; see FIG. 28. These polysilicon crowns will be the bottom electrodes for the capacitors. Lastly, apply capacitor dielectric and top electrode polysilicon and etch the portion outside of the memory cell array. Then apply planarizing BPSG; see FIG. 29.

FIGS. 30–35 a variation of the preferred embodiment of FIGS. 11–12. In particular, start with the structure of the FIG. 10 and blanket deposit polysilicon 54;see FIG. 30. Next, deposit BPSG 56 and pattern and etch down to the polysilicon to form openings at the storage node locations; see FIG. 31. Then deposit polysilicon 58 and conformal oxide. Anisotropically etch back the oxide to form oxide sidewalls 60; see FIG. 32.

Figure 35:
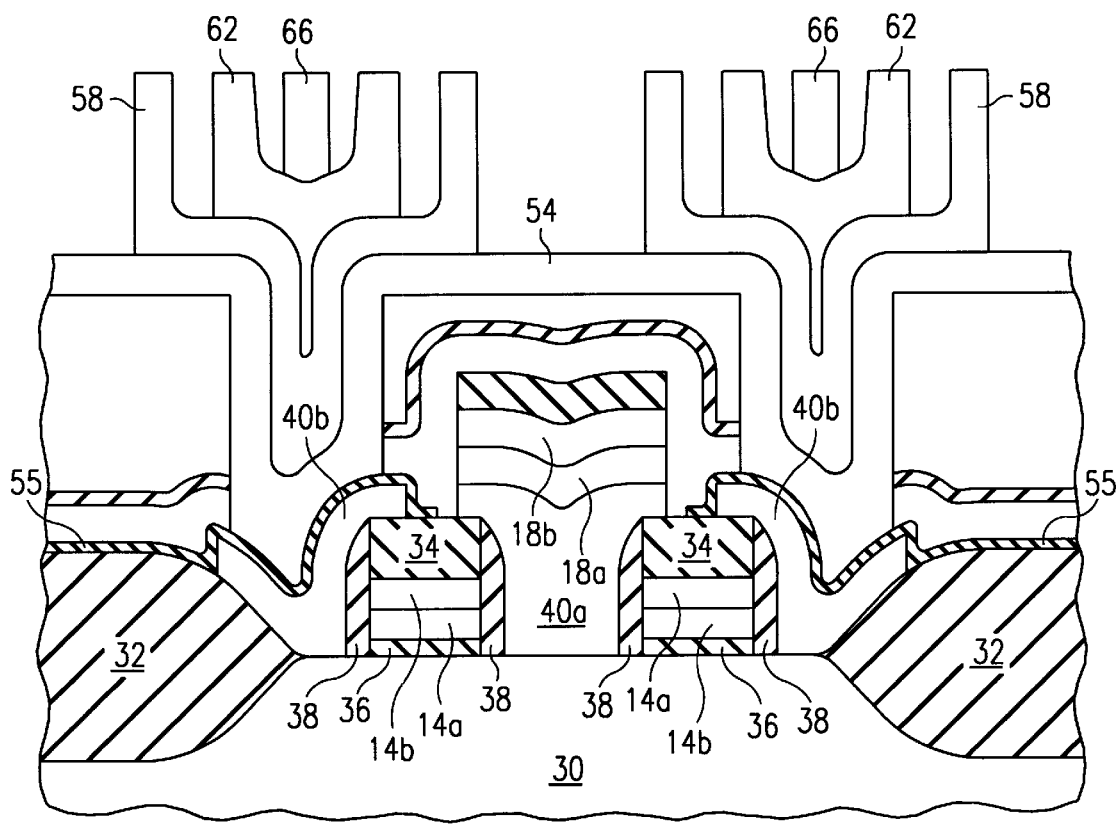

Repeat the polysilicon with oxide sidewall to form a crown with interior walls. In particular, deposit polysilicon 62 and conformal oxide, which is anisotropically etched back to form oxide sidewall 64. Then deposit another polysilicon layer 66; see FIG. 34. Lastly, do a planarization, such as CMP, or a polysilicon etch back to remove the horizontal top portions of polysilicon 58, 62, and 64. The wet etch to remove the BPSG and sidewall oxide; see FIG. 35 illustrating the polysilicon crown (polysilicon 58 with interior polysilicon walls 62 and 66. This provides a large area bottom electrode. The memory cells are completed by dielectric deposition and top electrode deposition.

What is claimed is:

1. A method of forming a memory cell, the method comprising the steps of:

forming a transfer gate at the face of a semiconductor region, the semiconductor region including a bit line contact region and storage node contact region wherein the transfer gate includes a first edge adjacent the bit line contact region and a second edge adjacent the storage node contact region;

surrounding the transfer gate with an insulating material;

forming a conductive layer over the transfer gate, over the bit line contact region and over the storage node contact region;

forming a masking layer over the conductive layer;

etching the masking layer to form a bit line contact window over a portion of the conductive layer;

then forming a bit line in contact with the conductive layer at the bit line contact window;

then etching the conductive layer with the etched masking layer and bit line in place, to separate a first portion of the conductive layer, in contact with the bit line contact region and the bit line, from a second portion of the conductive layer, in contact with the storage node contact region; and forming a storage node electrode electrically coupled to the second portion of the conductive layer.

2. The method of claim 1 wherein the step of forming a transfer gate comprises depositing a conductive gate layer, depositing an insulating layer and patterning and etching the conductive gate layer and the insulating layer.

3. The method of claim 2 wherein the conductive gate layer comprises a multilayer conductor.

4. The method of claim 3 wherein the step of depositing a conductive gate layer comprises the steps of depositing a polysilicon layer and then forming a silicide layer over the polysilicon layer.

5. The method of claim 2 wherein the insulating layer comprises a nitride layer.

6. The method of claim 2 wherein the step of surrounding the transfer gate comprises said step of depositing an insulating layer and further comprises the step of forming a sidewall insulator adjacent sidewalls of the transfer gate.

7. The method of claim 6 wherein the sidewall insulator comprises an oxide, sidewall insulator.

8. The method of claim 1 wherein the step of forming a conductive layer comprises the step of depositing a polysilicon layer.

9. The method of claim 1 wherein the conductive gate layer physically abuts the bit line contact region and the storage node contact region.

10. A method of forming a memory device, the method comprising the steps of:

forming first and second transfer gates at the face of a semiconductor region, the semiconductor region including a bit line contact region located between the first and second transfer gates, a storage node contact region located adjacent the first transfer gate, and a second storage node contact region located adjacent the second transfer gate;

surrounding the transfer gate with an insulating material;

forming a conductive layer over the transfer gate, over the bit line contact region and over the storage node contact region;

forming a masking layer over the conductive layer;

removing a portion of the masking layer so as to expose a portion of the conductive layer over the bit line contact regions and over portions of the first and second transfer gates which are adjacent to the bit line contact region;

forming a bit line layer over the masking layer and the exposed portion of the conductive layer;

forming a bit line by patterning and etching the bit line layer, the patterning and etching step exposing a portion of the conductive layer between the masking layer and the bit line; and removing the exposed portion of the conductive layer using the masking layer as a mask.

11. The method of claim 10 and further comprising the steps of:

Removing a portion of the masking layer over the first storage node contact region; and forming a storage node electrode of a storage capacitor in electrical contact with the first storage node contact region.

12. The method of claim 10 and further comprising the step of forming a sidewall insulator along sidewalls of the bit line.

13. A method of forming a memory device, the method comprising the steps of:

forming a conductive gate layer over a semiconductor region, the conductive layer being electrically insulated from the semiconductor region;

forming oxide sidewalls along sidewalls of the gate;

forming a polysilicon layer over the gate and abutting a bit line contact portion of the semiconductor region adjacent a first edge of the gate, the polysilicon layer also abutting a storage node contact portion of the semiconductor region adjacent an opposite edge of the gate;

forming an oxide layer over the polysilicon layer;

forming a bit line contact window by removing a portion of the oxide layer to expose a bit line contact portion of the polysilicon layer over the bit line contact portion of the semiconductor region;

forming a bit line conductor in electrical contact with the exposed portion of the polysilicon layer;

then etching the polysilicon layer with the bit line conductor and oxide layer in place to electrically isolate the bit line contact portion of the polysilicon layer from the remainder of the polysilicon layer;

forming a storage node conductor in electrical contact with a portion of the polysilicon layer over the storage node contact region of the semiconductor region;

forming a dielectric over the storage node conductor; and forming a cell plate conductor over the dielectric.

14. The method of claim 12 and further comprising the step of forming an oxide sidewall along sidewalls of the bit line conductor.

15. The method of claim 14 wherein the storage node conductor is formed so as to abut the oxide sidewall along the bit line conductor.

* * * * *